(12) United States Patent
Klee et al.

(10) Patent No.: US 6,515,402 B2
(45) Date of Patent: Feb. 4, 2003

(54) ARRAY OF ULTRASOUND TRANSDUCERS

(75) Inventors: Mareike Klee, Huekelhoven (DE); Tilman Schlenker, Aachen (DE); Olaf Dannappel, Aachen (DE); Hans-Peter Loebl, Monschau-Imgenbroich (DE); Georg Schmitz, Roetgen (DE); John Fraser, Woodinville, WA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/768,564

(22) Filed: Jan. 24, 2001

(65) Prior Publication Data

US 2002/0105250 A1 Aug. 8, 2002

(51) Int. Cl.$^7$ ............................................... H01L 41/08
(52) U.S. Cl. .......................... 310/324; 310/363; 310/364
(58) Field of Search ................................ 310/311, 322, 310/324, 363, 364, 366

(56) References Cited

U.S. PATENT DOCUMENTS

| 4,531,267 | A | * | 7/1985  | Royer ................... 310/324 X |
| 4,719,383 | A | * | 1/1988  | Wang et al. ................. 310/324 |
| 5,075,641 | A | * | 12/1991 | Weber .................... 310/324 X |
| 5,160,870 | A | * | 11/1992 | Carson et al. .......... 310/324 X |
| 5,185,589 | A | * | 2/1993  | Krishnaswamy et al. ....................... 310/324 X |
| 5,233,259 | A | * | 8/1993  | Krishnaswamy et al. ... 310/324 |
| 5,872,493 | A | * | 2/1999  | Ella ....................... 310/322 X |
| 5,873,153 | A | * | 2/1999  | Ruby et al. ............. 310/324 X |
| 5,889,351 | A | * | 3/1999  | Okumura et al. ........... 310/321 |
| 5,956,292 | A | * | 9/1999  | Bernstein ................ 310/334 X |
| 6,114,287 | A | * | 9/2000  | Lee et al. ..................... 505/473 |
| 6,180,252 | B1 | * | 1/2001  | Farrell et al. ................ 428/469 |
| 6,271,619 | B1 | * | 8/2001  | Yamada et al. ............. 310/324 |

* cited by examiner

Primary Examiner—Mark O. Budd
(74) Attorney, Agent, or Firm—John Vodopia

(57) ABSTRACT

The invention relates to an array of ultrasound transducers which each comprise a substrate (1), a membrane (2), a first electrode (4), a piezoelectric layer (5), and a second electrode (6), wherein the substrate (1) comprises at least one opening (3) which adjoins the membrane (2) at one side, while the piezoelectric layer (5) has a high piezoelectric coupling coefficient k and is textured. The invention further relates to an ultrasound transducer and to a method of manufacturing an array of ultrasound transducers.

2 Claims, 1 Drawing Sheet

ARRAY OF ULTRASOUND TRANSDUCERS

Figure 1:
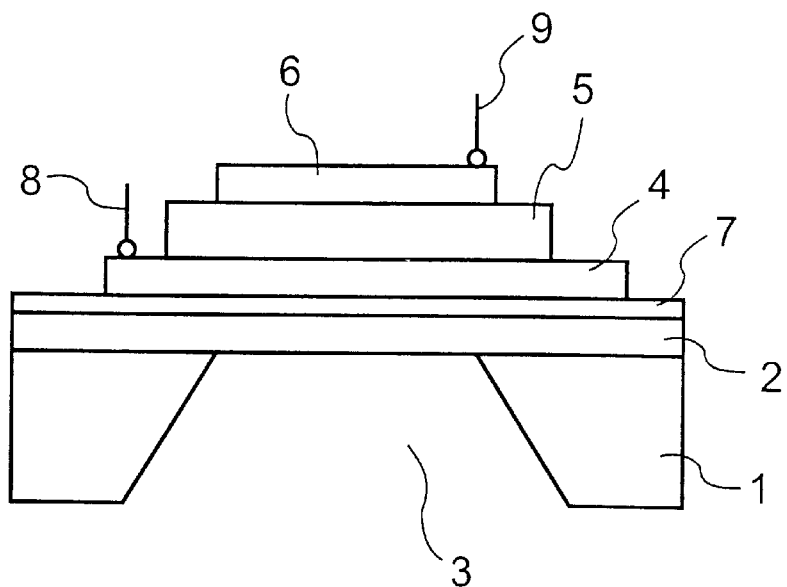

The invention relates to an array of ultrasound transducers which each comprise a substrate, a membrane, a first electrode, a piezoelectric layer, and a second electrode, said substrate comprising at least one opening which adjoins the membrane at one side. The invention further relates to an ultrasound transducer and to a method of manufacturing an ultrasound transducer.

The generation of ultrasonic sound takes place by purely mechanical means or by means of electroacoustic transducers which utilize the magnetostrictive or piezoelectric effect. Since ultrasound can be easily realized technically nowadays, it is widely used. Thus ultrasound is used for generating images in medical diagnostics or in nondestructive material testing.

The electroacoustical transducers used most widely are based on the piezoelectric effect. In practice, one-dimensional or two-dimensional array systems are mostly used in addition to single-transducer systems. Two-dimensional array systems are particularly interesting for the display of three-dimensional images.

The excitation of the piezoelectric elements in acoustic transducers takes place either in an AC field with a frequency of a few kHz up to several MHz or, in particular in image generation, by short oscillation bursts with a basic frequency of a few MHz and relative bandwidths of up to 100%. The excursion of the piezoelectric elements in the field direction generates a continuous or pulsatory ultrasound wave in the coupled medium such as, for example, water or biological tissue. The reflections changing in dependence on the tissue density and the throughput times changing with the path length are utilized for image generation in medical diagnostics.

Piezoelectric ultrasound transducers are manufactured from piezoelectric ceramic blocks nowadays. Piezoelectric ceramic blocks of exactly defined dimensions and with electrodes on the upper and lower sides of the blocks are mounted in an array in a mounting preform.

It is a disadvantage of these conventional systems that the control circuits must be separately constructed and cannot be integrated into the system.

Less expensive ultrasound transducer array systems are formed by the so-called piezoelectric micromachined ultrasound transducers (PMUT). The arrays of piezoelectric ultrasound transducers are provided directly on silicon. Such an ultrasound transducer comprises besides a silicon substrate a membrane on which a first electrode, a piezoelectric layer, and a second electrode are provided. The membrane can be obtained simply through etching away of the silicon so that an opening is created. The change in length of the piezoelectric element excites the membrane into oscillation. To manufacture an array of such ultrasound transducers, several openings are generated for the creation of several membranes on one silicon substrate.

Such an ultrasound transducer is known from U.S. Pat. No. 5,956,292. The material used for the piezoelectric layer is a ceramic material such as, for example, ZnO, AlN, $LiNbO_4$, $PbZr_xTi_{1-x}O_3$ ($0 \leq x \leq 1$), $BaTiO_3$ or $SrTiO_3$.

For broadband frequency applications, however, materials with a particularly high piezoelectric coupling coefficient k are required.

It is accordingly an object of the present invention to provide an improved ultrasound transducer with a piezoelectric layer which has a high piezoelectric coupling coefficient k.

This object is achieved by means of an array of ultrasound transducers which each comprise a substrate, a membrane, a first electrode, a piezoelectric layer, and a second electrode, said substrate comprising at least one opening which adjoins the membrane at one side, wherein said piezoelectric layer is a textured layer.

A clear increase in the piezoelectric coupling coefficient k is achieved through texturing of the piezoelectric layer as compared with a polycrystalline piezoelectric layer.

It is preferred that the piezoelectric layer is a monocrystalline layer.

An absolutely ideal texturized pattern is obtained if the piezoelectric layer is formed by a monocrystalline layer.

It is furthermore preferred that the material of one electrode is textured.

The manufacture of a piezoelectric layer on a textured electrode renders it possible to provide the material of the piezoelectric layer in a textured manner.

It is particularly highly preferred that the piezoelectric layer comprises a material chosen from the group $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/2}Nb_{2/3})O_3$—$PbTiO_3$, $Pb(Zn_{1/3}Nb_{2/3})_{1-x-y}(Mn_{1/2}Nb_{1/2})_xTi_yO_3$ ($0 \leq x \leq 1$, $0 \leq y \leq 1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0 \leq x \leq 1$), $Na(Sr_{1-x}Ba_x)_2Nb_5O_{15}$ ($0 \leq x \leq 1$), $BaTiO_3$, $(K_{1-x}Na_x)NbO_3$ ($0 \leq x \leq 1$), $(Bi,Na,K, Pb,Ba)TiO_3$, $(Bi,Na)TiO_3$, $Bi_7Ti_4NbO_{21}$, $(K_{1-x}Na_x)NbO_3$–$(Bi,Na,K,Pb,Ba)TiO_3$ ($0 \leq x \leq 1$), $a(Bi_xNa_{1-x})TiO_{3-b}(KNbO_{3-c})\frac{1}{2}(Bi_2O_3$—$Sc_2O_3)$ ($0 \leq x \leq 1$, $a+b+c=1$), $(Ba_aSr_bCa_c)Ti_xZr_{1-x}O_3$ ($0 \leq x \leq 1$, $a+b+c=1$), $(Ba_aSr_bLa_c)Bi_4Ti_4O_{15}$ ($a+b+C=1$), $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$ and $PbZr_xTi_{1-x}O_3$ ($0 \leq x \leq 1$) with and without dopants of La, Mn, Fe, Sb, Sr, Ni or combinations of these dopants.

It is advantageous that a barrier layer is provided on that side of the substrate which faces the piezoelectric layer.

This barrier layer prevents chemical interactions between the membrane and the layer present thereon during processing of the transducer.

It is preferred that the first and the second electrode are disposed at opposite ends of the piezoelectric layer.

By placing the electrodes at opposite ends of the piezoelectric layer a poled operation of the piezoelectric layer is enabled.

It is also preferred that the electrodes are disposed on the same surface of the piezoelectric layer.

It is furthermore preferred that at least one further electrode is disposed between the first and second electrodes.

The electrical impedance of the transducer is decreased by this electrodes arrangement.

It is advantageous that at least two electrodes are of the same polarity and at least one electrode is of opposite polarity, wherein electrodes of the same polarity are coupled in parallel.

By this means the electrical impedance of the transducer is reduced.

It is preferred that the electrodes form concentric rings.

The invention also relates to an array of ultrasound transducers which each comprise a substrate, a membrane, a first electrode, a piezoelectric layer, and a second electrode, said substrate comprising at least one opening which adjoins the membrane at one side, characterized in that a barrier layer is provided on that side of the membrane which faces the piezoelectric layer.

This barrier layer prevents chemical interactions between the membrane and the layer present thereon during processing of the transducer.

It is preferred that one of the electrodes is a textured electrode formed on the barrier layer.

It is also preferred that the barrier layer has a bending stiffness which is less than that of the membrane layer.

It is advantageous that the distance between the neutral plane of a transducer and the piezoelectric layer is larger than the thickness of the piezoelectric layer.

By this measures the effective coupling coefficient is enhanced.

It is also advantageous that the barrier layer is thicker than the piezoelectric layer.

The invention further relates to an ultrasound transducer which comprises a substrate, a membrane, a first electrode, a piezoelectric layer, and a second electrode, the substrate comprising at least one opening which adjoins the membrane at one side, wherein said piezoelectric layer is a textured layer.

The invention also relates to a method of manufacturing an array of ultrasound transducers which each comprise a substrate, a membrane, a first electrode, a piezoelectric layer, and a second electrode, the substrate comprising at least one opening which adjoins the membrane at one side, wherein said piezoelectric layer is manufactured in a textured manner.

The invention will be explained in more detail below with reference to a drawing and ten embodiments. In the drawing FIG. 1 shows the construction of an ultrasound transducer in cross-section, and FIG. 2 shows the construction of a further ultrasound transducer in cross-section.

Figure 2:
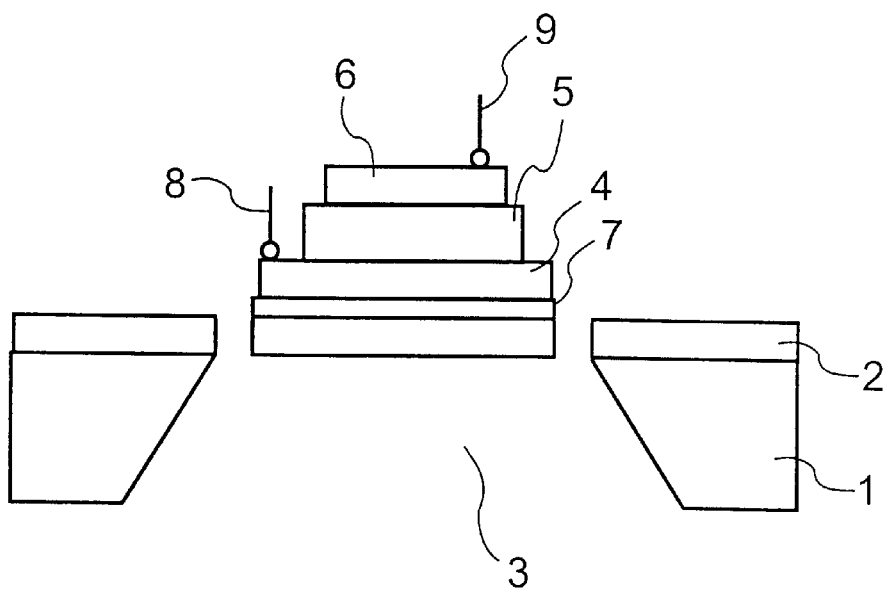

In FIG. 1, a possible embodiment of an ultrasound transducer comprises a substrate 1 which may comprise, for example, silicon, silicon with (100) orientation or (111) orientation, MgO with (100) orientation, LaAlO$_3$, sapphire, GaAs, ceramic materials such as, for example, ZrO$_2$ or Al$_2$O$_3$, ceramic materials such as, for example, ZrO$_2$ or A$_{12}$O$_3$ each with a planarizing layer, glass-ceramic materials, or glass materials. A membrane 2, which may comprise an inorganic material, an organic material, or a combination of inorganic and organic materials, is provided on the substrate 1. Inorganic materials used may be, for example, SiC, SiO$_2$, polycrystalline silicon, Si$_3$N$_4$, or layered systems made of these materials. At least one opening 3 is created in the substrate 1 by means of etching or stamping. The opening 3 adjoins the membrane 2 at one side. The membrane 2 present on the opening 3 is capable of oscillating thanks to this opening. If the substrate 1 comprises a material with an orientation, for example MgO with a (100) orientation, it may be preferred that the opening 3 does not pass fully through the substrate 1 but that a thin layer remains and forms the membrane 2.

A first electrode 4 lies on the membrane 2, which electrode comprises, for example, Pt with a layer thickness of 50 nm to 1 $\mu$m, Ti with a layer thickness of 1 to 20 nm/Pt with a layer thickness of 20 to 600 nm, Ti with a layer thickness of 1 to 20 nm/Pt with a layer thickness of 20 to 600 nm/Ti with a layer thickness of 1 to 20 nm, W, Ni, Ag, Mo, Au, Cu, Ti/Pt/Al, Ti/Ag, Ti/Ag/Ti, Ti/Ag/Ir, Ti/Ir, Ti/Pd, Ti/Ag$_{1-x}$Pt$_x$ ($0 \leq x \leq 1$), Ti/Ag$_{1-x}$Pd$_x$ ($0 \leq x \leq 1$), Ag$_{1-x}$Pt$_x$ ($0 \leq x \leq 1$), Ti/Pt$_{1-x}$Al$_x$ ($0 \leq x \leq 1$), Pt$_{1-x}$Al$_x$ ($0 \leq x \leq 1$), Ti/Ag/Pt$_{1-x}$Al$_x$ ($0 \leq x \leq 1$), Ti/Ag/Ru, Ru, Ru/RuO$_2$, Ti/Ru, Ti/Ir, Ti/Ir/IrO$_2$, Ti/Ag/Ir/IrO$_x$ ($0 \leq x \leq 2$), Ti/Ag/Ru/RuO$_x$ ($0 \leq x \leq 2$), Ti/Ag/Ru/Ru$_x$Pt$_{1-x}$ ($0 \leq x \leq 1$), Ti/Ag/Ru/Ru$_x$Pt$_{1-x}$/RuO$_y$ ($0 \leq x \leq 1$, $0 \leq y \leq 2$), Ti/Ag/Ru/RuO$_x$/Ru$_y$Pt$_{1-y}$ ($0 \leq x \leq 2$, $0 \leq y \leq 1$), Ti/Ag/Ru$_x$Pt$_{1-x}$ ($0 \leq x \leq 1$), Ti/Ag/Pt$_x$Al$_{1-x}$ ($0 \leq x \leq 1$), Pt$_x$Al$_{1-x}$/Ag/Pt$_y$Al$_{1-y}$ ($0 \leq x \leq 1$, $0 \leq y \leq 1$), Ti/Ag/Pt$_y$(RhO$_x$)$_{1-y}$ ($0 \leq x \leq 2$, $0 \leq y \leq 1$), Ti/Ag/RhO$_x$ ($0 \leq x \leq 2$), Ti/Ag/Pt$_x$Rh$_{1-x}$ ($0 \leq x \leq 1$), Ti/Ag/Pt$_y$(RhO$_x$)$_{1-y}$/Pt$_z$Rh$_{1-z}$ ($0 \leq x \leq 2$, $0 \leq y \leq 1$, $0 \leq z \leq 1$), Ti/Ag$_x$Pt$_{1-x}$/Ir ($0 \leq x \leq 1$), Ti/Ag$_x$Pt$_{1-x}$/Ir/IrO$_y$ ($0 \leq x \leq 1$, $0 \leq y \leq 2$), Ti/Ag$_x$Pt$_{1-x}$/Pt$_y$Al$_{1-y}$ ($0 \leq x \leq 1$, $0 \leq y \leq 1$), Ti/Ag$_x$Pt$_{1-x}$/Ru ($0 \leq x \leq 1$), Ti/Ag$_x$Pt$_{1-x}$/Ru/RuO$_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Rh/RhO$_2$, Ti/Ni/Al/ITO, Ti/Ni, Ti/W/Ti, W$_x$Ti$_{1-x}$ ($0 \leq x \leq 1$), W$_x$Ti$_{1-x}$/Al(Cu) ($0 \leq x \leq 1$), W$_x$Ti$_{1-x}$/Al(Si) ($0 \leq x \leq 1$), W$_x$Ti$_{1-x}$/Al ($0 \leq x \leq 1$) or Ti/Cu. A piezoelectric layer 5 is provided on the first electrode 4. The layer thickness of the piezoelectric layer 5 preferably lies between 1 and 50 $\mu$m. To achieve higher bandwidths, materials with a high piezoelectric coupling coefficient k are used in the piezoelectric layer 5. A second electrode 6 is provided on the piezoelectric layer 5, which electrode comprises, for example, Al, Al doped with Si, Al doped with Cu, Pt with a layer thickness of 50 nm to 1 $\mu$m, Ti with a layer thickness of 1 to 20 nm/Pt with a layer thickness of 20 to 600 nm, Ti with a layer thickness of 1 to 20 nm/Pt with a layer thickness of 20 600 nm/Ti with a layer thickness of 1 to 20 nm, W, Ni, Ag, Mo, Au, Cu, Ti/Pt/Al, Ti/Ag, Ti/Ag/Ti, Ti/Ag/Ir, Ti/Ir, Ti/Pd, Ti/Ag$_{1-x}$Pt$_x$ ($0 \leq x \leq 1$), Ti/Ag$_{1-x}$Pd$_x$ ($0 \leq x \leq 1$), Ag$_{1-x}$Pt$_x$ ($0 \leq x \leq 1$), Ti/Pt$_{1-x}$Al$_x$ ($0 \leq x \leq 1$), Pt$_{1-x}$Al$_x$ ($0 \leq x \leq 1$), Ti/Ag/Pt$_{1-x}$Al$_x$ ($0 \leq x \leq 1$), Ti/Ag/Ru, Ru, Ru/RuO$_2$, Ti/Ru, Ti/Ir, Ti/Ir/IrO$_2$, Ti/Ag/Ir/IrO$_x$ ($0 \leq x \leq 2$), Ti/Ag/Ru/RuO$_x$ ($0 \leq x \leq 2$), Ti/Ag/Ru/Ru$_x$Pt$_{1-x}$ ($0 \leq x \leq 1$), Ti/Ag/Ru/Ru$_x$Pt$_{1-x}$/RuO$_y$ ($0 \leq x \leq 1$, $0 \leq y \leq 2$), Ti/Ag/Ru/RuO$_x$/Ru$_y$Pt$_{1-y}$ ($0 \leq x \leq 2$, $0 \leq y \leq 1$), Ti/Ag/Ru$_x$Pt$_{1-x}$ ($0 \leq x \leq 1$), Ti/Ag/Pt$_x$Al$_{1-x}$ ($0 \leq x \leq 1$), Pt$_x$Al$_{1-x}$/Ag/Pt$_y$Al$_{1-y}$ ($0 \leq x \leq 1$, $0 \leq y \leq 1$), Ti/Ag/Pt$_y$(RhO$_x$)$_{1-y}$ ($0 \leq x \leq 2$, $0 \leq y \leq 1$), Ti/Ag/Rh/RhO$_x$ ($0 \leq x \leq 2$), Ti/Ag/Pt$_x$Rh$_{1-x}$ ($0 \leq x \leq 1$), Ti/Ag/Pt$_y$(RhO$_x$)$_{1-y}$/Pt$_z$Rh$_{1-z}$ ($0 \leq x \leq 2$, $0 \leq y \leq 1$, $0 \leq z \leq 1$), Ti/Ag$_x$Pt$_{1-x}$/Ir ($0 \leq x \leq 1$), Ti/Ag$_x$Pt$_{1-x}$/Ir/IrO$_y$ ($0 \leq x \leq 1$, $0 \leq y \leq 2$), Ti/Ag$_x$Pt$_{1-x}$/Pt$_y$Al$_{1-y}$ ($0 \leq x \leq 1$, $0 \leq y \leq 1$), Ti/Ag$_x$Pt$_{1-x}$/Ru ($0 \leq x \leq 1$), Ti/Ag$_x$Pt$_{1-x}$/Ru/RuO$_y$ ($0 \leq x \leq 1$, $0 \leq y \leq 2$), Ti/Ag/Cr, Ti/Ag/Ti/ITO, Ti/Ag/Cr/ITO, Ti/Ag/ITO, Ti/Ni/ITO, Ti/Rh, Ti/Rh/RhO$_2$, Ti/Ni/Al/ITO, Ti/Ni, Ti/W/Ti, W$_x$Ti$_{1-x}$ ($0 \leq x \leq 1$), W$_x$Ti$_{1-x}$/Al(Cu) ($0 \leq x \leq 1$), W$_x$Ti$_{1-x}$/Al(Si) ($0 \leq x \leq 1$), W$_x$Ti$_{1-x}$/Al ($0 \leq x \leq 1$) or Ti/Cu. In alternate embodiments other than that shown in the drawings, the electrodes 4,6 may be disposed at laterally opposite ends of the piezoelectric layer 5, for laterally poled operation of the piezoelectric layer 5. Additional electrodes may be be laterally dispersed between the ends of the piezoelectric layer 5 to decrease the electrical impedance of the transducer. For instance, four electrodes may be formed at discrete locations across a lateral surface of the piezoelectric layer 5, with alternate electrodes being of alternate polarity and electrodes of the same polarity being coupled in parallel for reduced electrical impedance.

It may be advantageous that a barrier layer 7 is provided between the membrane 2 and the first electrode 4. This barrier layer 7 prevents potential chemical interactions between the membrane 2 and the layers present thereon, for example a first electrode 4 or a piezoelectric layer 5. The barrier layer 7 may comprise, for example, Al$_2$O$_3$, ZrO$_2$, TiO$_2$, HfO$_2$, MgO or LaAlO$_3$, including a composite of several of these materials. In addition, a textured electrode may be readily formed on the barrier layer 7. The barrier layer 7 preferably has a bending stiffness which is substantially less than that of the membrane layer. This property, together with the thickness of the barrier layer 7, enables the distance between the neutral plane of the transducer and the piezoelectric layer 5 to be somewhat larger than the thickness of the piezoelectric layer 5, which improves the effective coupling coefficient of the transducer. Perferably the barrier layer 7 is thicker than the piezoelectric layer 5.

A voltage can be applied to the piezoelectric layer 5 through a first current supply contact 8 and a second current supply contact 9, each connected to a respective electrode 4, 6, and the piezoelectric layer 5 may thus be brought into oscillation. If the piezoelectric layer 5 is excited by acoustic energy, the resulting voltage can be taken off through the first and second current supply contacts 8, 9 and measured.

A protective layer of an organic or inorganic material, or a combination of these materials, may be provided over the entire ultrasound transducer. The organic material used may be, for example, polybenzocyclobutene or polyimide, and the inorganic material may be, for example, $Si_3N_4$, $SiO_2$ or $Si_xO_yN_z$ ($0 \leq x \leq 1$, $0 \leq y \leq 1$, $0 \leq z \leq 1$).

The material in the piezoelectric layer 5 is textured, preferably with a column-type growth, for achieving high piezoelectric coupling coefficients k. The crystals of the piezoelectric material in a textured piezoelectric layer 5 have a preferred direction with respect to an external sampling geometry and are not statistically randomly arranged with respect to one another as regards their crystallographic orientation.

A textured piezoelectric layer 5 may be achieved by means of thin-film processes such as, for example, sol-gel processes, sputtering, CVD (Chemical Vapor Deposition) processes, or printing techniques. The piezoelectric layer 5 may also be provided on the first electrode 4 through bonding or gluing of previously sintered and mechanically processed layers of the piezoelectric materials.

A further alternative is formed by the so-called templated grain growth (DGG) method. In this method, a polycrystalline layer is provided on a monocrystalline template. The polycrystalline layer is converted into a textured monocrystalline layer through heating at high temperatures.

Materials which may be used for the piezoelectric layer 5 are, for example, ferroelectric materials, electrostrictive materials, as well as special piezoelectric materials. Thus, for example, $Pb(Zn_{1/3}Nb_{2/3})O_3$—$PbTiO_3$, $Pb(Mg_{1/3}Nb_{2/3})O_3$—$PbTiO_3$, $Pb(Ni_{1/3}Nb_{2/3})O_3$—$PbTiO_3$, $Pb(Sc_{1/3}Nb_{2/3})O_3$—$PbTiO_3$, $Pb(Zn_{1/3}Nb_{2/3})_{1-x-y}(Mn_{1/2}Nb_{1/2})_xTi_yO_3$ ($0 \leq x \leq 1$, $0 \leq y \leq 1$), $Pb(In_{1/2}Nb_{1/2})O_3$—$PbTiO_3$, $Sr_3TaGa_3Si_2O_{14}$, $K(Sr_{1-x}Ba_x)_2Nb_5O_{15}$ ($0 \leq x \leq 1$), $Na(Sr_{1-x}Ba_x)_2Nb_5O_{15}$ ($0 \leq x \leq 1$), $BaTiO_3$, $(Ka_{1-x}Na_x)NbO_3$ ($0 \leq x \leq 1$), $(Bi,Na,K, Pb,Ba)TiO_3$, $(Bi,Na)TiO_3$, $Bi_7Ti_4NbO_{21}$, $(K_{1-x}Na_x)NbO_3$—$(Bi,Na,K,Pb,Ba)TiO_3$ ($0 \leq x \leq 1$), $a(Bi_xNa_{1-})TiO_3$—$b(KNbO_{3-c})$—$½(Bi_2O_3$—$SC_2O_3)$ ($0 \leq x \leq 1$, $a+b+c=1$), $(Ba_aSr_bCa_c)Ti_xZr_{1-x}O_3$ ($0 \leq x \leq 1$, $a+b+c=1$), $(Ba_aSr_bLa_c)Bi_4Ti_4O_{15}$ ($a+b+c=1$), $Bi_4Ti_3O_{12}$, $LiNbO_3$, $La_3Ga_{5.5}Nb_{0.5}O_{14}$, $La_3Ga_5SiO_{14}$, $La_3Ga_{5.5}Ta_{0.5}O_{14}$ and $PbZr_xTi_{1-x}O_3$ ($0 \leq x \leq 1$) with and without dopants of La, Mn, Fe, Sb, Sr, Ni or combinations of these dopants may be used in the piezoelectric layer 5.

The structured deposition of the piezoelectric layer 5 on an oriented first electrode 4, on a textured barrier layer 7, or a textured membrane 2 renders it possible to influence the texture of the piezoelectric layer 5.

Thus it is possible, for example, to grow a piezoelectric layer with a (111) orientation through the use of a first electrode 4 of Pt with a (111) orientation which is not thermally pre-treated. The use of a thermally pre-treated first electrode of Pt with a (111) orientation renders it possible to grow piezoelectric layers with a (100) and (111) orientation, or exclusively with a (100) orientation.

Alternative methods may be used for influencing the growth of the materials of the piezoelectric layer 5 besides the deposition on a thermally pre-treated first electrode 4 of Pt with (111) orientation.

The use of a membrane 2 or a barrier layer 7 of MgO with a (100) orientation enables the growth first of (100) oriented Pt as the first electrode 4. As a result, the piezoelectric materials listed above can be grown on the textured first electrode 4 in the form of a textured layer.

The texture of the piezoelectric layer 5 can be improved further towards the monocrystalline state through further processes such as, for example, laser annealing.

To improve the growth, the crystallinity, and the orientation of the material of the piezoelectric layer 5, a nucleating layer may be provided on the first electrode 4.

A further possibility for enhancing the piezoelectric coupling factor k is the polarization of the ceramic material in the piezoelectric layer 5. The ceramic material can be polarized in the field direction through the application of a bias voltage to the first and second electrodes 4, 6.

In the embodiment of an ultrasound transducer shown in FIG. 1, the first electrode 4 is arranged below the piezoelectric layer 5 and the second electrode 6 above the piezoelectric layer 5. The application of an AC voltage to the electrodes 4, 6 through the first and second current supply contacts 8, 9 causes the piezoelectric layer 5 to be excited into a longitudinal or transverse oscillation perpendicular to the layer thickness.

Alternatively, the electrodes 4, 6 may be provided in structured manner on only one side of the piezoelectric layer 5, for example on the side opposed to the membrane 2. In this case, the application of an AC voltage will excite the piezoelectric layer 5 into a longitudinal oscillation in the plane of the layer. A nucleating layer may be provided on the barrier layer 7 in this case for improving the growth, the crystallinity, and the orientation.

Alternatively, the substrate 1 may comprise on its rear side an insulating layer of $SiO_2$ or $Si_3N_4$ or a combination of these materials.

A plurality of such ultrasound transducers may be provided on a substrate 1. A one-dimensional or two-dimensional array of ultrasound transducers can be manufactured through a suitable electrical connection of the individual ultrasound transducers. The piezoelectric layer 5, the first and second electrodes 4, 6, as well as the nucleating layer, if present, are structured in such a manner in this case that the individual ultrasound transducers are spatially separated from one another.

A membrane 2 is prepared on a substrate 1 for manufacturing an array of ultrasound transducers. For this purpose, a layer of a suitable material may be deposited on the substrate 1. Openings 3 are created in the substrate 1 by means of an etching process, which openings pass fully through the substrate 1 and are bounded at one side by the membrane.

Alternatively, for example, the substrate 1 may be etched away only partly, so that a thin layer remains and constitutes the membrane 2.

A barrier layer 7 may be provided on the membrane 2. A first electrode 4 is then provided on the membrane 2 or on the barrier layer 7, as applicable, wherever an opening 3 is present in the substrate. A textured piezoelectric layer 5 is provided on each first electrode 4, and a second electrode 6 is provided on each piezoelectric layer 5. The first and second electrodes 4, 6 are then provided with a first and second current supply contact 8, 9, respectively.

Alternatively, an opening 3 may extend partly into the membrane 2. For this purpose, portions of the membrane 2 lying in mutually opposed regions of an opening 3 are removed, for example by means of etching or sputtering. The resonance frequency or the acoustic impedance of the membrane 2 can be adapted to the medium to be acoustically vibrated by this measure.

FIG. 2 shows a further embodiment of an ultrasound transducer. In this embodiment, portions of the membrane 2 lying in mutually opposed regions of an opening 3 have been removed, for example by means of etching or sputtering. Furthermore, the layers lying on the membrane 2 such as, for example, the barrier layer 7, the first electrode 4, the piezoelectric layer 5, and the second electrode 6, are at most as wide as the region of the membrane 2 which adjoins an opening 3. The layers are thus connected to the substrate 1 in a cross-section taken perpendicularly to FIG. 2.

The manufacture of an array of ultrasound transducers comprising a substrate 1 of a ceramic material may also take place in an alternative manner. To this end, first the substrate 1 is manufactured in a film casting process from a ceramic powder such as, for example, $ZrO_2$ or $Al_2O_3$, and an organic binder. Openings are made in the substrate 1 in a stamping process in a number as required for the array of ultrasound transducers. Then the substrate is fully covered with a film of a ceramic material, laminated, and sintered. A first electrode 4 is provided on the sintered membrane 2 wherever there is an opening 3 in the substrate 1. A nucleating layer, for example comprising $Bi_4Ti_3O_{12}$, is provided on each electrode 4. The nucleating layer covers the first electrode 4 only partly, preferably over 10% thereof. Then the ceramic material of the piezoelectric layer 5 is provided on each nucleating layer, preferably in a thick-film process, and is sintered in a textured manner at 1275 ° C. Which orientation will be present in the piezoelectric layer 5 depends on the exact composition and doping of the ceramic material. Finally, the second electrode 6 is provided on each piezoelectric layer 5, and each electrode 4, 6 is provided with a respective current supply contact 8, 9.

Alternatively, other methods may be used for manufacturing a textured piezoelectric layer 5, for example the use of a textured substrate 1, a textured barrier layer 7, or a textured first electrode 4.

Alternatives in the construction of an array of ultrasound transducers or one ultrasound transducer and in the shaping of the various layers and/or the opening 3 are familiar to those skilled in the art.

Embodiments of the invention will be explained in more detail below, representing examples of how the invention may be realized in practice.

Embodiment 1

An array of ultrasound transducers comprises a silicon substrate 1 which has an insulating layer of $Si_3N_4$ and $SiO_2$ on one side. On the opposite side, a membrane 2 composed of a layered system of $SiO2/Si_3N4/SiO_2$ is provided. The substrate 1 has a plurality of openings 3 which each adjoin the membrane 2 at one side. A barrier layer 7 of $TiO_2$ is present on the membrane 2. A first electrode 4 of Ti/Pt is provided on the barrier layer 7 wherever an opening 3 was etched into the substrate 1. The Pt-containing layer of the first electrode 4 is grown so as to have a (111) orientation. A layer of $PbZr_{0.35}Ti_{0.65}O_3$ with (100) orientation and (111) orientation is provided on each first electrode 4 so as to form the piezoelectric layer 5. A second electrode 6 of Pt lies on each piezoelectric layer 5. The first and second electrodes 4, 6 of each ultrasound transducer are connected to a first and second current supply contact 8, 9, respectively. The individual ultrasound transducers are electrically connected on the substrate 1 such that a one-dimensional array of ultrasound transducers is obtained. The application of a bias voltage to each individual ultrasound transducer at elevated temperatures polarizes the ceramic material in the piezoelectric layer 5 in the field direction. An array of ultrasound transducers is obtained thereby in which each ultrasound transducer has a very high piezoelectric coupling coefficient k.

Embodiment 2

An array of ultrasound transducers comprises a silicon substrate 1 which has an insulating layer of $Si_3N_4$ and $SiO_2$ on one side. On the opposite side, a membrane 2 composed of a layered system of $SiO_2$/polycrystalline silicon/$SiO_2$ is provided. The substrate 1 has a plurality of openings 3 which each adjoin the membrane 2 at one side. A barrier layer 7 of $TiO_2$ is present on the membrane 2. A first electrode 4 of Ti/Pt is provided on the barrier layer 7 wherever an opening 3 was etched into the substrate 1. The Pt-containing layer of the first electrode 4 is grown so as to have a (111) orientation. A thin nucleating layer of $PbZr_{0.35}Ti_{0.65}O_3$ is provided on each first electrode 4. A layer of $Pb(Zn_{1/3}Nb_{2/3})O_3$—$PbTiO_3$ with a (001) orientation is grown on each nucleating layer so as to form the piezoelectric layer 5. A second electrode 6 of Pt lies on each piezoelectric layer 5. The first and second electrodes 4, 6 of each ultrasound transducer are connected to a first and second current supply contact 8, 9, respectively. The individual ultrasound transducers are electrically connected on the substrate 1 such that a one-dimensional array of ultrasound transducers is obtained. The application of a bias voltage to each individual ultrasound transducer at elevated temperatures polarizes the ceramic material in the piezoelectric layer 5 in the field direction. An array of ultrasound transducers is obtained thereby in which each ultrasound transducer has a very high piezoelectric coupling coefficient k.

Embodiment 3

An array of ultrasound transducers comprises a silicon substrate 1 which has an insulating layer of $Si_3N_4$ and $SiO_2$ on one side. On the opposite side, a membrane 2 composed of a layered system of $SiO_2$/polycrystalline silicon/$SiO_2$ is provided. The substrate 1 has a plurality of openings 3 which each adjoin the membrane 2 at one side. A barrier layer 7 of $TiO_2$ is present on the membrane 2. A first electrode 4 of Ti/Pt is provided on the barrier layer 7 wherever an opening 3 was etched into the substrate 1. The Pt-containing layer of the first electrode 4 is grown so as to have a (111) orientation. A thin nucleating layer of $PbZr_{0.35}Ti_{0.65}O_3$ is provided on each first electrode 4. A layer of $Pb(Mg_{1/3}Nb_{2/3})O_3$—$PbTiO_3$ with a (001) orientation and with a (111) orientation is grown on each nucleating layer so as to form the piezoelectric layer 5. A second electrode 6 of Pt lies on each piezoelectric layer 5. The first and second electrodes 4, 6 of each ultrasound transducer are connected to a first and second current supply contact 8, 9, respectively. The individual ultrasound transducers are electrically connected on the substrate 1 such that a one-dimensional array of ultrasound transducers is obtained. The application of a bias voltage to each individual ultrasound transducer at elevated temperatures polarizes the ceramic material in the piezoelectric layer 5 in the field direction. An array of ultrasound transducers is obtained thereby in which each ultrasound transducer has a very high piezoelectric coupling coefficient k.

Embodiment 4

An array of ultrasound transducers has a substrate 1 of silicon which supports an insulating layer of $Si_3N_4$ and $SiO_2$ on one side. On the opposite side, a membrane 2 formed by a layered system of $SiO_2$/polycrystalline silicon/$SiO_2$ is provided. The substrate 1 has a plurality of openings 3 which adjoin the membrane at one side. Portions of the membrane 2 lying in mutually opposed regions of an opening 3 have been removed by means of etching. A barrier layer 7 of $ZrO_2$ is present on the membrane 2. A first electrode 4 of Ti/Pt is provided on the barrier layer 7 wherever there is an opening 3 in the substrate 1. The Pt-containing layer of the first electrode 4 is grown so as to have a (111) orientation. A thin nucleating layer of $PbZr_{0.35}Ti_{0.65}O_3$ is provided on each first electrode 4. A layer of $Pb(Ni_{1/3}Nb_{2/3})O_3$—$PbTiO_3$ with a (001) orientation and with a (111) orientation is grown on each nucleating layer so as to form the piezoelectric layer 5. A second electrode 6 of TiW/Al lies on each piezoelectric layer 5. The layers present on the membrane are at most as wide as the membrane 2 in the region of an opening 3. The first and second electrodes 4, 6 of each ultrasound transducer are provided with a first and a second current supply contact 8, 9, respectively. The individual ultrasound transducers are electrically connected on the substrate 1 in such a way that a onedimensional array of ultrasound transducers is obtained. This results in an array of ultrasound transducers in which each ultrasound transducer has a very high piezoelectric coupling coefficient k.

Embodiment 5

An array of ultrasound transducers comprises a silicon substrate 1 which comprises an insulating layer of $Si_3N_4$ and $SiO_2$ on one side. On the opposite side, a membrane 2 composed of a layered system of $SiO_2$/polycrystalline silicon/$SiO_2$ is provided. The substrate 1 has a plurality of openings 3 which adjoin the membrane 2 at one side. A barrier layer 7 of MgO with a (100) orientation is present on the membrane 2. A thin nucleating layer of $PbZr_{0.35}Ti_{0.65}O_3$ is provided on the barrier layer 7 wherever there is an opening 3 in the substrate 1. A layer of $Pb(Zn_{1/3}Nb_{2/3})O_3$—$PbTiO_3$ with a (001) orientation is provided as the iezoelectric layer 5 on each nucleating layer. A first and a second electrode 4, 6 of TiW/Al are present on each piezoelectric layer 5. The two electrodes 4, 6 are structured in such a way hat two electrode surfaces on the upper side of the piezoelectric layer 5 form an ultrasound transducer each time. The first and second electrodes 4, 6 of each ultrasound transducer are provided with a first and a second current supply contact 8, 9. The individual ultrasound transducers are electrically connected on the substrate 1 in such a way that a one-dimensional array of ultrasound transducers is obtained. This results in an array of ultrasound transducers in which each ultrasound transducer has a very high piezoelectric coupling coefficient k.

Embodiment 6

An array of ultrasound transducers comprises a silicon substrate 1 which comprises an insulating layer of $Si_3N_4$ and $Sio_2$ on one side. On the opposite side, a membrane 2 composed of a layered system of $SiO_2/Si_3N_4$ is provided. The substrate 1 has several openings 3 which adjoin the membrane 2 at one side. A barrier layer 7 of MgO with a (100) orientation is present on the membrane 2. A layer of $PbZr_{0.15}Ti_{0.85}O_3$ doped with lanthanum and manganese and with a (100) orientation is grown on the barrier layer 7 so as to form the piezoelectric layer 5. A first and a second electrode 4, 6 of Pt are present on each piezoelectric layer 5. The two electrodes 4, 6 are structured such that two electrode surfaces on the upper side of the piezoelectric layer 5 form an ultrasound transducer each time. The first and second electrodes 4, 6 of an ultrasound transducer are provided with a first and second current supply contact 8, 9, respectively. The individual ultrasound transducers are electrically connected on the substrate 1 such that a one-dimensional array of ultrasound transducers is obtained. The application of a bias voltage to each individual ultrasound transducer at elevated temperatures polarizes the ceramic material in the piezoelectric layer 5 in the field direction. An array of ultrasound transducers is obtained thereby in which each ultrasound transducer has a very high piezoelectric coupling coefficient k.

Embodiment 7

An array of ultrasound transducers comprises a silicon substrate 1 which comprises an insulating layer of $Si_3N_4$ and $SiO_2$ on one side. On the opposite side, a membrane 2 composed of a layered system of $SiO_2/Si_3N_4/SiO_2$ is provided. The substrate 1 has several openings 3 which adjoin the membrane 2 at one side. A barrier layer 7 of MgO with a (100) orientation lies on the membrane 2. A first electrode 4 of Ti/Pt is provided on the barrier layer 7 wherever there is an opening 3 in the substrate 1. The Pt-containing layer of the first electrode 4 is grown so as to have a (100) orientation. A thin nucleating layer of $PbZr{\cdot}_{0.35}Ti{\cdot}_{0.65}O_3$ is provided on each first electrode 4. A layer of $Pb(Mg_{1/3}Nb_{2/3})O_3$—$PbTiO_3$ with a (001) orientation is grown on each nucleating layer so as to form the piezoelectric layer 5. A second electrode 6 of Pt is present on each piezoelectric layer 5. The first and second electrodes 4, 6 of each ultrasound transducer are provided with a first and second current supply contact 8, 9, respectively. The individual ultrasound transducers are electrically connected on the substrate 1 such that a one-dimensional array of ultrasound transducers is obtained. This results in an array of ultrasound transducers in which each ultrasound transducer has a very high piezoelectric coupling coefficient k.

Embodiment 8

An array of ultrasound transducers comprises a silicon substrate 1 which comprises an insulating layer of $Si_3N_4$ and $SiO_2$ on one side. On the opposite side, a membrane 2 composed of a layered system of $SiO_2/Si_3N_4/SiO_2$ is provided. The substrate 1 has several openings 3 which adjoin the membrane 2 at one side. A barrier layer 7 of MgO with a (100) orientation lies on the membrane 2. A first electrode 4 of Ti/Pt is provided on the barrier layer 7 wherever there is an opening 3 in the substrate 1. The Pt-containing layer of the first electrode 4 is grown so as to have a (100) orientation. A layer of $Pb(Zn_{1/3}Nb_{2/3})O_3$—$PbTiO_3$ with a (001) orientation is grown on each first electrode 4 as the piezoelectric layer 5. A second electrode 6 of Pt is present on each piezoelectric layer 5. The first and second electrodes 4, 6 of each ultrasound transducer are provided with a first and second current supply contact 8, 9, respectively. The individual ultrasound transducers are electrically connected on the substrate 1 such that a one-dimensional array of ultrasound transducers is obtained. This results in an array of ultrasound transducers in which each ultrasound transducer has a very high piezoelectric coupling coefficient k.

Embodiment 9

An array of ultrasound transducers comprises a silicon substrate 1 which has an insulating layer of $Si_3N_4$ and $SiO_2$ on one side. On the opposite side, a membrane 2 composed of a layered system of $SiO_2$/polycrystalline silicon/$SiO_2$ is provided. The substrate 1 has a plurality of openings 3 which each adjoin the membrane 2 at one side. A barrier layer 7 of MgO with a (100) orientation lies on the membrane 2. A thin nucleating layer of $PbZr_{0.35}Ti_{0.65}O_3$ is provided on the barrier layer 7 wherever there is an opening 3 in the substrate 1. A layer of $Pb(Mg_{1/3}Nb_{2/3})O_3$—$PbTiO_3$ with a (001)

orientation is grown on each nucleating layer so as to form the piezoelectric layer 5. A first and a second electrode 4, 6 of TiW/Al lie on each piezoelectric layer 5. The two electrodes 4, 6 are structured such that two electrode surfaces on the upper side of the piezoelectric layer 5 form an ultrasound transducer each time. The first and second electrodes 4, 6 of each ultrasound transducer are provided with a first and second current supply contact 8, 9, respectively. They are electrically connected to other ultrasound transducers on the substrate 1 in such a way that a one-dimensional array of ultrasound transducers is obtained.

Embodiment 10

An array of ultrasound transducers comprises a 400 $\mu$m thick substrate 1 manufactured in a film casting process from yttrium-stabilized $ZrO_2$ with an average grain size of 0.4 $\mu$m and a suitable organic binder. Openings 3 were made in the substrate 1 in a stamping process in a number as required for the envisaged array of ultrasound transducers. The openings 3 penetrated fully through the substrate. The substrate 1 was subsequently fully covered with a second, 10 $\mu$m thick foil of yttrium-stabilized $ZrO_2$, laminated, and sintered. A substrate 1 with a sintered membrane 2 was obtained thereby. A first electrode 4 of Pt was provided on the sintered membrane 2 wherever there was an opening in the substrate 1. The first electrode 4 was coated for approximately 10% with a nucleating layer of needle-shaped crystals of $Bi_4Ti_3O_{12}$ with an average diameter of 2 to 5 $\mu$m. The needle-shaped crystals lay flat on the first electrode 4 and thus initiated a preferred direction, acting as crystallization nuclei in the subsequent sintering process. Then $Pb(Sc_{1/3}Nb_{2/3})O_3$—$PbTiO_3$ was provided on each nucleating layer in a thick-film process in the form of a ceramic powder of 30 $\mu$m thickness and was sintered in a textured manner at 1275° C. The respective second electrodes 6 of Ag were subsequently provided. The first and second electrodes 4, 6 were provided with respective first and second current supply contacts 8, 9 and connected to other ultrasound transducers on the substrate 1 in such a manner that a one-dimensional array of ultrasound transducers was obtained.

What is claimed is:

1. An array of ultrasound transducers, each comprising:
    a substrate;
    a membrane;
    a first electrode;
    a piezoelectric layer; and
    a second electrode comprises at least one opening which adjoins the membrane at one side, such that a barrier layer is provided on a side of the membrane which faces the piezoelectric layer, wherein the barrier layer has a bending stiffness which is less than that of the membrane layer.

2. The array of ultrasound transducers as claimed in claim 1, wherein a distance between a neutral plane of a transducer and the piezoelectric layer is larger than a thickness of the piezoelectric layer.

* * * * *